(12) United States Patent
Colbeck

(10) Patent No.: US 7,078,971 B2
(45) Date of Patent: Jul. 18, 2006

(54) CLASS AB CMOS AMPLIFIERS

(75) Inventor: Roger Colbeck, Stittsville (CA)

(73) Assignee: Potentia Semiconductor Inc., Wilmington, DE (US)

( * ) Notice: Subject to any disclaimer, the term of this patent is extended or adjusted under 35 U.S.C. 154(b) by 53 days.

(21) Appl. No.: 10/991,513

(22) Filed: Nov. 19, 2004

(65) Prior Publication Data

US 2006/0109056 A1    May 25, 2006

(51) Int. Cl.
*H03F 3/45*  (2006.01)
(52) U.S. Cl. ........................... 330/255; 330/261
(58) Field of Classification Search ................ 330/255, 330/257, 263, 264, 261, 267, 269, 253
See application file for complete search history.

(56) References Cited

U.S. PATENT DOCUMENTS

| | | | | |
|---|---|---|---|---|
| 4,912,425 A | * | 3/1990 | Kobayashi et al. | ......... 330/255 |
| 5,285,168 A | * | 2/1994 | Tomatsu et al. | ............ 330/255 |
| 6,163,217 A | * | 12/2000 | Matsubara et al. | ......... 330/255 |
| 6,246,288 B1 | * | 6/2001 | Yamamoto | .................. 330/255 |
| 6,930,551 B1 | * | 8/2005 | Ivanov et al. | ................ 330/264 |

OTHER PUBLICATIONS

"CMOS Switched-Capacitor Filters for a PCM Voice CODEC" by R. Gregorian et al., IEEE Journal of Solid-State Circuits, vol. SC-14, No. 6, Dec. 1979, pp. 970-980.
"Introduction To CMOS Op-Amps And Comparators" by R. Gregorian, John Wiley & Sons, 1999, pp. 100-113.

* cited by examiner

*Primary Examiner*—Khanh Van Nguyen

(57) ABSTRACT

A class AB output stage of a CMOS amplifier has a level-shifting voltage follower constituted by a level-shifting transistor and a current source. A bias circuit replicates the level-shifting voltage follower in a feedback arrangement to produce a variable bias voltage for the current source of both the main and replica level-shifters. The arrangement serves to control the output voltage of the level-shifter such that it provides the amplifier with a relatively constant quiescent current of the output stage over variations of manufacturing process, supply voltage, and temperature. The level shifting function can be facilitated by a resistive on-state of a power-down transistor between the level-shifting and load transistors.

19 Claims, 2 Drawing Sheets

CLASS AB CMOS AMPLIFIERS

This invention relates to CMOS amplifiers, and especially to CMOS amplifiers having a class AB output stage.

BACKGROUND

As is well known, an amplifier with a class A output stage can not supply an output current greater than a quiescent current of the output stage. If it is desired to supply an output current greater than the quiescent current, a different class of amplifier is required. An amplifier with a class B output stage can supply a large output current with zero quiescent current, but introduces a large crossover distortion. A class AB output stage provides a compromise, enabling the output current to be greater than the quiescent current without excessive distortion.

It is well known to provide a CMOS amplifier with a class AB output stage. Typically, such an amplifier may be a differential amplifier which has a differential input stage, and may be referred to as an operational amplifier or opamp.

It is desirable for a differential amplifier to have a low offset voltage, in order to reduce errors in the amplifier output especially for small differential input voltages. For example, it may be desirable for a CMOS differential amplifier to have an offset voltage of less than about 1 mV.

Many class AB CMOS amplifiers have the disadvantage of complex design involving relatively large numbers of transistors. It is desirable to provide a class AB CMOS amplifier using a relatively small number of transistors, in a simple architecture, in order to reduce the amplifier area and to minimize the number of transistors that can contribute to offset.

"CMOS Switched-Capacitor Filters for a PCM Voice CODEC" by R. Gregorian et al., IEEE Journal of Solid-State Circuits, Vol. SC-14, No. 6, December 1979, pages 970–980 shows in FIG. 11 an example of such an amplifier. A similar example is shown in the book "Introduction To CMOS Op-Amps And Comparators" by R. Gregorian, John Wiley & Sons, 1999, in FIG. 4.15 on page 109.

However, especially with typical variations in manufacturing processes, supply voltages, and temperature (referred to as PVT), in such circuits it is difficult to provide a low and controlled quiescent current. In particular, in these known CMOS amplifiers the quiescent current of the class AB output stage can change by a factor of two or more with changes, resulting from PVT variations, in characteristics such as a threshold voltage of a level-shifting transistor of the amplifier.

Accordingly, there is a need to provide an improved CMOS amplifier.

SUMMARY OF THE INVENTION

According to one aspect of this invention there is provided a CMOS amplifier having a class AB output stage, the output stage comprising: two complementary transistors having source-drain paths coupled in series between two voltage supply rails and providing an output from a junction therebetween; a level-shifting transistor and a further transistor having source-drain paths coupled in series between the two voltage supply rails for supplying a signal from a junction therebetween to one of said complementary transistors; and a signal input to the other of said complementary transistors and to the level-shifting transistor; the amplifier further comprising a bias circuit for producing a variable bias voltage for said further transistor, the bias circuit comprising: a replica of the level-shifting transistor and a replica of said further transistor coupled in series between the two voltage supply rails in a similar manner to the level-shifting transistor and said further transistor, the replica of said further transistor also being responsive to said variable bias voltage; and a circuit responsive to a voltage at a junction between the replica of the level-shifting transistor and the replica of said further transistor for producing said variable bias voltage in a manner to reduce variations of a quiescent current of the output stage.

The term "replica" is used herein to refer to a copy or duplicate of an original, which may be of different scale to the original, and which is not necessarily identical to the original in all respects, but is similar to the original at least in the manner in which it responds to PVT variations.

Conveniently, the circuit for producing said variable bias voltage comprises a first transistor responsive to the voltage at the junction between the replica of the level-shifting transistor and the replica of said further transistor to produce a first current; a current mirror arranged to mirror the first current to produce a second current, and a second transistor responsive to the second current and a bias voltage to produce said variable bias voltage.

The level-shifting transistor and said further transistor can have their source-drain paths coupled in series via a source-drain path of another transistor between the level-shifting transistor and said junction between the level-shifting transistor and said further transistor. In this case, the source-drain path of said another transistor preferably has an appreciable resistance for producing a voltage drop due to current passed by the level-shifting transistor. For example, said another transistor can be provided for power-down purposes and can have on and off states for respectively operating and powered-down conditions of the amplifier. In this case, the resistance of this transistor can be predetermined, or it can be relatively indefinite, but in any event it is appreciably greater than a typical source-drain on-resistance of other transistors in the amplifier provided for power-down purposes.

Preferably the bias circuit includes a replica of said another transistor having a source-drain path coupled between the replica of the level-shifting transistor and the replica of said further transistor, said junction between the replica of the level-shifting transistor and the replica of said further transistor being between the replica of said another transistor and the replica of said further transistor.

In an embodiment of the invention, the amplifier includes an input stage for providing the signal input to said other of said complementary transistors and to the level-shifting transistor, the input stage comprising two source-coupled differential input transistors and drains coupled to active load transistors.

Preferably the input stage comprises a folded cascode arrangement including two cascode transistors having sources coupled to the drains of the differential input transistors and the active load transistors of the differential input transistors are coupled together and to the drain of one of the cascode transistors.

The amplifier can further include voltage clamps cross-coupled between the drains of the differential input transistors.

Another aspect of the invention provides a method of reducing variation, due to manufacturing process, voltage, and/or temperature variations, of a quiescent current of a class AB output stage of a CMOS amplifier including a level-shifting transistor and a further transistor constituting a current source for the level-shifting transistor, comprising the steps of: replicating a circuit of the level-shifting and further transistors in a bias circuit; in the bias circuit, producing a variable bias voltage dependent upon a voltage of the replicated circuit of the level-shifting and further transistors; and biasing said further transistor and a replica of said further transistor in the bias circuit in dependence upon said variable bias voltage.

Conveniently the step of producing the variable bias voltage in the bias circuit comprises producing a first current dependent upon said voltage of the replicated circuit, mirroring the first current to produce a second current, and producing the variable bias voltage in dependence upon the second current and a constant bias voltage.

The circuit of the level-shifting and further transistors can comprise an additional transistor coupled between the level-shifting transistor and said further transistor, in which case the method preferably further comprises the step of providing an appreciable resistance of the additional transistor for dropping an appreciable voltage due to current passed by the level-shifting transistor.

The method preferably further includes the steps of supplying a signal to the output stage from a differential input stage having source-coupled differential input transistors and cascode transistors in a folded cascode arrangement, and providing a control voltage for active load transistors of the differential input transistors from a drain of one of the cascode transistors. The method may further include the step of limiting voltage between the drains of the differential input transistors.

A further aspect of the invention provides a CMOS amplifier including a level-shifting transistor and a current source transistor for the level-shifting transistor, the amplifier further comprising a bias circuit including a copied level-shifting transistor and a copied current source transistor arranged in a similar manner to the level-shifting transistor and the current source transistor, and a circuit responsive to a level-shifted voltage produced by the copied level-shifting transistor and copied current source transistor for producing a variable bias voltage, the variable bias voltage being supplied to a gate of the current source transistor and to a gate of the copied current source transistor.

Viewed alternatively, the invention provides a class AB output stage of a CMOS amplifier, having a level-shifting voltage follower constituted by a level-shifting transistor and a current source, with a bias circuit which replicates the level-shifting voltage follower in a feedback arrangement to produce a variable bias voltage for the current source of both the main and replica level-shifters. The arrangement serves to control the output voltage of the level-shifter such that it provides the amplifier with a relatively constant quiescent current of the output stage over variations of manufacturing process, supply voltage, and temperature.

BRIEF DESCRIPTION OF THE DRAWINGS

The invention will be further understood from the following description by way of example with reference to the accompanying drawings, in which the same references are used in different figures to denote similar elements and in which.

DETAILED DESCRIPTION

Figure 1:
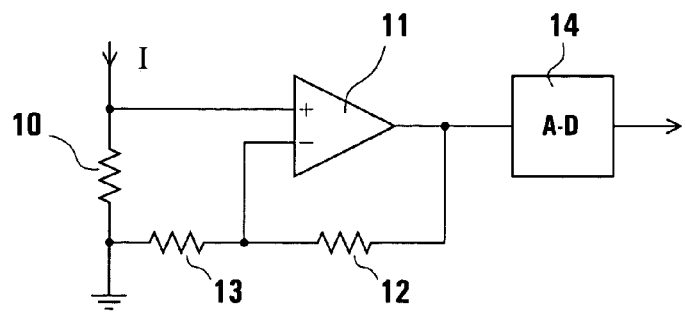
FIG. 1 schematically illustrates an example of a known application of a CMOS amplifier.

Referring to the drawings, FIG. 1 illustrates an arrangement in which a resistor 10 of resistance Rs is used for sensing a current I to ground. For example, the current I may be a power supply current which it is desired to monitor, the resistor 10 producing a small voltage Vin+=I.Rs which is supplied to the non-inverting or +input of a differential CMOS amplifier 11. A feedback resistor 12, having a resistance Rf, is connected between an output of the amplifier 11 and its inverting or − input at a voltage Vin−, and a resistor 13 having a resistance Rg is connected between the inverting input and ground, so that an output voltage Vout of the amplifier is ideally equal to (1+Rf/Ri)I.Rs. For example, this output voltage is supplied to an analog-digital (A-D) converter 14 which produces at its output a corresponding digital value.

It is typically desired for the resistance Rs to be small, e.g. 0.1 Ω or less; consequently the differential input voltage to the amplifier 11 is also small and the input voltages are close to ground level. To reduce monitoring errors, the amplifier 11 is therefore required to have little offset voltage and an input common mode range that extends to or below ground level.

In addition, it is desirable for the amplifier 11 to operate with a low quiescent current, and for it to have a reasonable output drive capability, in order that a single design of the amplifier 11 can be used in various different applications, of which the application shown in FIG. 1 is only one example. For such reasons, it is desirable for the CMOS amplifier 11 to have a class AB output stage.

Figure 2:
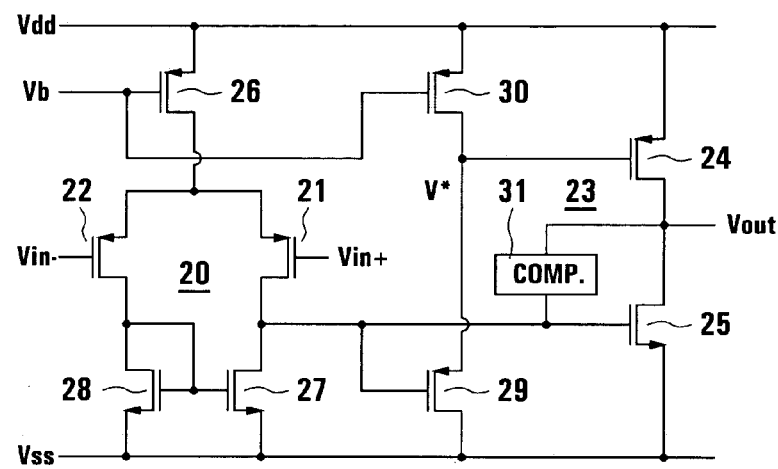
FIG. 2 schematically illustrates a known form of a class AB CMOS amplifier.

FIG. 2 illustrates a CMOS amplifier, having a differential input stage and a class AB output stage, which is known from the documents referred to above. In FIG. 2, and in FIG. 3 described later below, P-channel and N-channel MOS transistors are represented schematically by symbols with source electrode arrows pointing respectively towards and away from the gate, and for clarity and simplicity the substrates of the transistors and connections thereto are not shown. Likewise, for clarity and simplicity, bias voltage sources, and other components such as may be provided for power-down purposes, are not shown (except as described further below with reference to FIG. 3) but can be provided in known manner.

For brevity in the following description, "P-channel MOS transistor" is abbreviated to PMOST, and "N channel MOS transistor" is abbreviated to NMOST.

Referring to FIG. 2, the CMOS amplifier shown therein has a differential input stage 20, for the amplifier inputs Vin+ and Vin− to gates of PMOSTs 21 and 22 respectively, and a class AB output stage 23 for the amplifier output Vout from the interconnected drains of PMOST 24 and NMOST 25, whose sources are connected to respective supply voltage rails at voltages Vdd, for example +3.3 V, and Vss, for example zero volts.

The input stage 20 also includes a PMOST 26 having its gate supplied with a bias voltage Vb, its source connected to the Vdd rail, and its drain connected to the sources of the differentially-connected PMOSTs 21 and 22, for which the PMOST 26 acts as a current source. The drains of the PMOSTs 21 and 22 are connected to the drains of active load NMOSTs 27 and 28 respectively, whose sources are connected to the Vss rail and whose gates are connected together and to the drain of the PMOST 22. A single-ended output of the input stage 20 is taken from the drain of the PMOST 21, and is connected to the gate of the NMOST 25 and to the gate of a level-shifting PMOST 29 of the output stage 23. The PMOST 29 has its drain connected to the Vss rail and its source connected to the drain of a further PMOST 30 and to the gate of the PMOST 24. The PMOST 30 has its source connected to the Vdd rail and the bias voltage Vb supplied to its gate; it serves as a load or current source for the level-shifting PMOST 29. A frequency compensation circuit 31, comprising a resistor-capacitor network, is optionally connected between the outputs of the output and input stages of the amplifier; other arrangements or connections of a frequency compensation circuit can be provided instead.

It may be desired for such an amplifier to be able to supply an output load current of for example up to 200 µA, and to have a much smaller output stage quiescent current (i.e. drawn from the Vdd rail when the output current is zero), for example of the order of 20 µA. In addition, it may be desired for the amplifier to have an input offset voltage of for example about 1 mV or less, and to have an input common mode range extending to zero volts or below.

In practice, manufacturing process, supply voltage, and temperature (PVT) variations are typically such that these desires can not be met. In particular, the quiescent current is dependent upon the supply voltage Vdd and the threshold voltage of the level-shifting PMOST 29. For example, for a given threshold voltage of the PMOST 29, a level-shifted voltage V* at the gate of the PMOST 24 is substantially constant, so that an increase of the supply voltage Vdd increases the bias for the PMOST 24 and hence increases the quiescent current conducted via the PMOST 24. In addition, for a given supply voltage Vdd, the voltage V* is decreased, and the quiescent current is consequently increased, by a decrease of the gate-source threshold voltage of the PMOST 29, for example as a result of manufacturing process variations or temperature changes. As a result of such PVT variations, the quiescent current may change by 100% or more.

Figure 3:
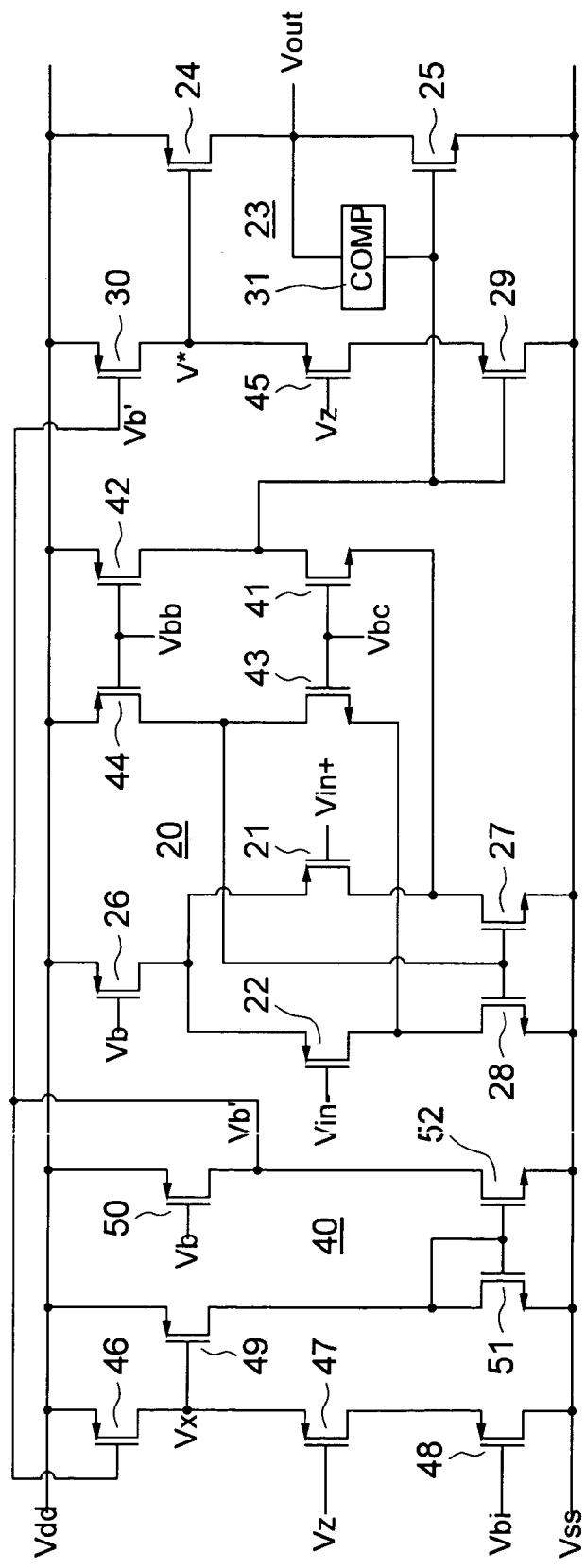
FIG. 3 schematically illustrates a class AB CMOS amplifier in accordance with an embodiment of the invention.

This difficulty is reduced or eliminated in a class AB CMOS amplifier in accordance with an embodiment of the invention as shown in FIG. 3. The amplifier of FIG. 3 comprises a differential input stage 20 which is modified in known manner from that of FIG. 2 to include a folded cascode arrangement as described below, a class AB output stage 23 which is similar to that of FIG. 2 except as described below, and an additional bias circuit 40.

More particularly, in the input stage 20 of the amplifier of FIG. 3 the interconnected drains of the PMOST 21 and NMOST 27 are connected to the source of an NMOST 41, whose drain is connected to the drain of a PMOST 42 having its source connected to the Vdd rail and a bias voltage Vbb supplied to its gate. Similarly, the interconnected drains of the PMOST 22 and NMOST 28 are connected to the source of an NMOST 43, whose drain is connected to the drain of a PMOST 44 having its source connected to the Vdd rail and the bias voltage Vbb supplied to its gate. The gates of the NMOSTs 41 and 43 are supplied with a bias voltage Vbc. In the amplifier of FIG. 3, the single-ended output of the input stage 20 is taken from the drain of the NMOST 41 instead of the drain of the PMOST 21 as in the amplifier of FIG. 2, and the gates of the NMOSTs 27 and 28 are connected to the drain of the NMOST 43 instead of the drain of the PMOST 22 as in the amplifier of FIG. 2. The input stage 20 in the amplifier of FIG. 3 is a folded cascode arrangement, the NMOSTs 41 and 43 being cascode transistors.

This configuration of the gates of the active load PMOSTs 27 and 28 being connected to the drain of only one of the cascode transistors 41 and 43 (or of the input PMOSTs 21 and 22 in FIG. 2) creates a differential-to-single-ended conversion. To provide a fully differential amplifier instead, the two output stages of such an amplifier can be driven from both sides of the input stage to provide dual + and − outputs. Such an amplifier can be used in high performance analog circuits in order to minimize common mode and power-supply noise problems.

The output stage 23 in the amplifier of FIG. 3 differs from that of FIG. 2 in that the gate of the PMOST 30 is supplied with a variable bias voltage Vb' from the bias circuit 40, instead of being supplied with the constant bias voltage Vb as in the amplifier of FIG. 2.

In addition, instead of being connected directly to the source of the level-shifting PMOST 29 as in the amplifier of FIG. 2, in the amplifier of FIG. 3 the interconnected drain of the PMOST 30 and gate of the PMOST 24 are connected to the source of a PMOST 45, whose drain is connected to the source of the level-shifting PMOST 29 and whose gate is supplied with a control signal Vz. The PMOST 45 has a known power-down function, being turned off by a first state of the signal Vz, thereby allowing the voltage V* to be pulled up by another power-down transistor (for clarity and simplicity, this and further power-down transistors are not shown in the drawings) so that the PMOST 24 passes substantially no current in a power-down state of the amplifier, and being turned on by a second state of the signal Vz for normal operation of the amplifier. In the amplifier of FIG. 3 the PMOST 45 also serves an additional function, as described later below.

The bias circuit 40 in the CMOS amplifier serves to produce the bias voltage Vb', and comprises PMOSTs 46 to 50 and NMOSTs 51 and 52. The level-shifting chain of PMOSTs 30, 45, and 29 in the output stage is replicated in the bias circuit 40 by the PMOSTs 46, 47, and 48 respectively. Thus the PMOST 46 is matched to the PMOST 30, and like the PMOST 30 has its source connected to the Vdd rail and its gate supplied with the bias voltage Vb'. The PMOST 48 is matched to the level-shifting PMOST 29, and has its drain connected to the Vss rail and its gate supplied with a bias voltage Vbi. The PMOST 47 is matched to the PMOST 45, and has its source connected to the drain of the PMOST 47, its drain connected to the source of the PMOST 48, and its gate supplied with the control voltage Vz.

The NMOSTs 51 and 52 are matched and form a current mirror with their sources connected to the Vss rail and their gates connected together and to the drain of the NMOST 51. The PMOST 49 has its source connected to the Vdd rail, its drain connected to the drain of the NMOST 51, and its gate connected to the drain of the PMOST 46, from which it is supplied with a bias circuit level-shifted voltage Vx. The PMOST 50 has its source connected to the Vdd rail, its gate supplied with the bias voltage Vb, and its drain connected to the drain of the NMOST 52, the variable bias voltage Vb' being taken from these interconnected drains. The PMOSTs 49 and 50 are matched to one another.

By way of example, the transistor characteristics and bias voltages may be selected so that, with the control voltage Vz in its second state to turn on the PMOST 47 for normal operation, the PMOST 49 and the NMOST 51 pass a current of nominally 1 µA. This is mirrored by the NMOST 52, so that it and the PMOST 50 also pass a current of nominally 1 µA, thereby determining a nominal value of the variable bias voltage Vb'. This is fed back to the gate of the PMOST 46, which thereby determines a value of the voltage Vx supplied to the gate of the PMOST 49. The bias circuit 40 thus incorporates a differencing circuit, or amplifier, with feedback such that Vx~Vb (Vx is approximately equal to Vb). Although FIG. 3 shows a particular form of this circuit using the current mirror PMOSTs 51 and 52, other forms of differencing circuit or amplifier can be used instead to achieve a similar result of making Vx~Vb.

As the PMOSTs 46 to 48 replicate the PMOSTs 30, 45, and 29 of the output stage, and the same bias voltage Vb' is supplied to the PMOSTs 46 and 30, it follows that the voltage V*~Vx. The bias voltage Vb' can be nominally similar to the bias voltage Vb, but instead of being a relatively fixed value is a variable bias voltage that is affected by PVT variations of the PMOST 48, and hence of the PMOST 29. The variation of the bias voltage Vb' compensates for the PVT variation of the PMOST 29 in such manner that the quiescent current passed by the PMOST 24 is substantially constant.

For example, a further diode-connected PMOST (not shown), with its source connected to the Vdd rail and its gate connected to its drain, can be arranged to pass a predetermined bias current to produce the fixed bias voltage vb. The PMOST 24 can be matched in a scaled manner to this further PMOST, for example with a scaling factor of 20, so that the quiescent current passed by the PMOST 24 is nominally 20 times this predetermined bias current. For example the predetermined bias current may be about 1 μA and the quiescent current may be about 20 μA.

In the amplifier of FIG. 3, as a result of the feedback in the bias circuit 40 any variations of the supply voltage Vdd tend to be followed by the voltages Vb' and Vx, and hence by the voltage V* to maintain a substantially constant quiescent current passed by the PMOST 24. Similarly, manufacturing process and temperature variations affecting the level-shifting PMOST 29 also affect the matched PMOST 48, causing the bias circuit 40 to modify the bias voltage Vb' in a similar manner to substantially reduce the adverse effects of these variations, and in particular to maintain the quiescent current passed by the PMOST 24 substantially constant.

A consequence of the provision and operation of the bias circuit 40 as described above is that current passed by the level-shifting PMOST 29 can vary considerably over PVT variations. Although this current variability is very small, it can be used to advantage in providing the required level shifting from the voltage at the output of the input stage to the voltage V*.

More particularly, instead of the PMOST 45 being arranged simply to be turned on like a switch for normal operation of the amplifier, it is arranged to provide an appreciable resistance in its on state. The current passed by the level-shifting PMOST 29 flows through this resistance of the PMOST 45, producing a voltage drop which increases as the level shifting current increases, thereby decreasing the change in level-shifting current that is needed for the necessary voltage level shift. The PMOST 47 in the bias circuit 40 operates in the same manner to facilitate accurate replication in the bias circuit 40 of the operation of the level-shifting circuit.

For example, the on-state resistance of the PMOST 45 may be of the order of about ten times a normal on-resistance value for such a transistor providing a power-down function. The on-state resistance is dependent upon the width/length ratio of the transistor. Whereas a transistor having only the power-down function of the PMOST 45 might normally have a W/L ratio of at least 3/1, and other transistors in the level shifting circuit may have a W/L ratio of 1/1, the PMOSTs 45 and 47 may have a W/L ratio of 1/3 to make them more resistive. For example, these transistors may be sufficiently resistive to drop many tens or hundreds of millivolts when passing the level-shifting current.

As discussed above, it is desirable for the CMOS amplifier also to have a low offset voltage. In the amplifier of FIG. 3, a low offset voltage is facilitated for example by the PMOSTs 42 and 44 passing currents of about 0.5 μA and having weak transconductance Gm, by the PMOSTs 21 and 22 passing currents of about 1 μA, and by providing these PMOSTs and the NMOSTs 27 and 28 with relatively large areas to reduce their contributions to offset.

The common mode range of the amplifier is enhanced by the cascode arrangement described above, which allows the voltages at the drains of the PMOSTs 21 and 22 to fall to the saturation voltages of the NMOSTs 27 and 28, rather than only their gate-source voltages as in the input stage of FIG. 2. The common mode range can be extended to below ground by applying a back-bias to the input PMOSTs 21 and 22.

In order to improve transient performance, voltage clamp devices can be provided to limit the voltages at the drains of the PMOSTs 21 and 22 from rising too close to the supply voltage Vdd in response to transients.

Figure 4:
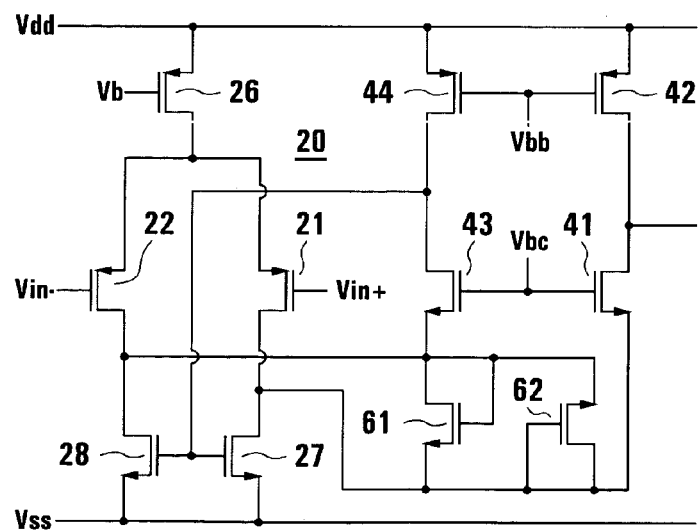
FIG. 4, which is on the same sheet as FIGS. 1 and 2, schematically illustrates an input stage of the amplifier of FIG. 3 with a cross-coupled voltage clamping arrangement.

For example, FIG. 4 illustrates the input stage 20 of the CMOS amplifier of FIG. 3, further including clamp devices in the form of cross-coupled NMOSTs 61 and 62, each having its gate and drain connected to the drain of one of the PMOSTs 21 and 22 and its source connected to the drain of the other of the PMOSTs 21 and 22. This arrangement is desirable because the gates of the NMOSTs 27 and 28, being connected to the drain of the NMOST 43, are not driven with a constant bias. These voltage clamps have minimal impact on the offset of the amplifier.

Although a particular embodiment of the invention has been described in detail above, it will be appreciated that numerous changes may be made. For example, the voltages and transistor types may be reversed, and different forms of bias and/or current source arrangement may be adopted. In addition, the input stage 20 can have any desired form, and can have a single-ended input rather than differential inputs as described. The CMOS amplifier can be fully differential, with a differential input stage driving dual level shifters and a differential output stage. As discussed above, the bias circuit 40 can have a different form of amplifier or differencing circuit providing feedback to make Vx~Vb.

The frequency compensation circuit 31 can optionally be omitted or additionally connected to the output of the level-shifter. Although the PMOST 45 can be used to advantage by making its on-state resistive as described above, it, and its replica PMOST 47 in the bias circuit 40 (and other power-down transistors that may be provided but are not shown), can optionally be omitted if a power-down function of the CMOS amplifier is not required.

Also, although the above description refers to the CMOS amplifier as having a class AB output stage with complementary transistors, it will be appreciated that the invention can also apply to non-complementary variations having equivalent level-shifting requirements.

Furthermore, although the invention is described above in the context of a level-shifting circuit in a class AB output stage of a CMOS amplifier, it can be appreciated that substantially the same principles can be applied for any level-shifting circuit of a CMOS amplifier regardless of the ultimate purpose for which the level-shifting circuit is provided. Accordingly, the invention is generally applicable to CMOS level-shifting circuits.

These and numerous other modifications, variations, and adaptations which may occur to those of ordinary skill in the art may be made without departing from the scope of the invention as defined in the claims.

The invention claimed is:

1. A CMOS amplifier having a class AB output stage, the output stage comprising:
   two complementary transistors having source-drain paths coupled in series between two voltage supply rails and providing an output from a junction therebetween;
   a level-shifting transistor and a further transistor having source-drain paths coupled in series between the two voltage supply rails for supplying a signal from a junction therebetween to one of said complementary transistors; and
   a signal input to the other of said complementary transistors and to the level-shifting transistor;
   the amplifier further comprising a bias circuit for producing a variable bias voltage for said further transistor, the bias circuit comprising:
   a replica of the level-shifting transistor and a replica of said further transistor coupled in series between the two voltage supply rails in a similar manner to the level-shifting transistor and said further transistor, the replica of said further transistor also being responsive to said variable bias voltage; and
   a circuit responsive to a voltage at a junction between the replica of the level-shifting transistor and the replica of said further transistor for producing said variable bias voltage in a manner to reduce variations of a quiescent current of the output stage.

2. An amplifier as claimed in claim 1 wherein the circuit for producing said variable bias voltage comprises a first transistor responsive to the voltage at the junction between the replica of the level-shifting transistor and the replica of said further transistor to produce a first current; a current mirror arranged to mirror the first current to produce a second current, and a second transistor responsive to the second current and a bias voltage to produce said variable bias voltage.

3. An amplifier as claimed in claim 2 wherein the level-shifting transistor and said further transistor have their source-drain paths coupled in series via a source-drain path of another transistor between the level-shifting transistor and said junction between the level-shifting transistor and said further transistor, and the source-drain path of said another transistor has an appreciable resistance for producing a voltage drop due to current passed by the level-shifting transistor.

4. An amplifier as claimed in claim 3 wherein the bias circuit includes a replica of said another transistor having a source-drain path coupled between the replica of the level-shifting transistor and the replica of said further transistor, said junction between the replica of the level-shifting transistor and the replica of said further transistor being between the replica of said another transistor and the replica of said further transistor.

5. An amplifier as claimed in claim 1 wherein the level-shifting transistor and said further transistor have their source-drain paths coupled in series via a source-drain patch of another transistor between the level-shifting transistor and said junction between the level-shifting transistor and said further transistor, and the source-drain path of said another transistor has an appreciable resistance for producing a voltage drop due to current passed by the level-shifting transistor.

6. An amplifier as claimed in claim 5 wherein the bias circuit includes a replica of said another transistor having a source-drain path coupled between the replica of the level-shifting transistor and the replica of said further transistor, said junction between the replica of the level-shifting transistor and the replica of said further transistor being between the replica of said another transistor and the replica of said further transistor.

7. An amplifier as claimed in claim 6 and including an input stage for providing the signal input to said other of said complementary transistors and to the level-shifting transistor, the input stage comprising two source-coupled differential input transistors and drains coupled to active load transistors.

8. An amplifier as claimed in claim 7 wherein the input stage comprises a folded cascode arrangement including two cascode transistors having sources coupled to the drains of the differential input transistors and drains coupled to current source transistors, wherein gates of the active load transistors of the differential input transistors are coupled together and to the drain of one of the cascode transistors.

9. An amplifier as claimed in claim 8 and including voltage clamps cross-coupled between the drains of the differential input transistors.

10. An amplifier as claimed in claim 1 and including an input stage for providing the signal input to said other of said complementary transistors and to the level-shifting transistor, the input stage comprising two source-coupled differential input transistors and drains coupled to active load transistors.

11. An amplifier as claimed in claim 10 wherein the input stage comprises a folded cascode arrangement including two cascode transistors having sources coupled to the drains of the differential input transistors and drains coupled to current source transistors, wherein gates of the active load transistors of the differential input transistors are coupled together and to the drain of one of the cascode transistors.

12. An amplifier as claimed in claim 11 and including voltage clamps cross-coupled between the drains of the differential input transistors.

13. A method of reducing variation, due to manufacturing process, voltage, and/or temperature variations, of a quiescent current of a class AB output stage of a CMOS amplifier including a level-shifting transistor and a further transistor constituting a current source for the level-shifting transistor, comprising the steps of:
   replicating a circuit of the level-shifting and further transistors in a bias circuit;
   in the bias circuit, producing a variable bias voltage dependent upon a voltage of the replicated circuit of the level-shifting and further transistors; and
   biasing said further transistor and a replica of said further transistor in the bias circuit in dependence upon said variable bias voltage.

14. A method as claimed in claim 13 wherein the step of comprises producing a first current dependent upon said voltage of the replicated circuit, mirroring the first current to produce a second current, and producing the variable bias voltage in dependence upon the second current and a constant bias voltage.

15. A method as claimed in claim 13 wherein the circuit of the level-shifting and further transistors comprises an additional transistor coupled between the level-shifting transistor and said further transistor, the method further comprising the step of providing a resistance of the additional transistor for dropping an appreciable voltage due to current passed by the level-shifting transistor.

16. A method as claimed in claim 13 and further including the step of supplying a signal to the output stage from a differential input stage having source-coupled differential input transistors and cascode transistors in a folded cascode arrangement.

17. A method as claimed in claim 16 and including the step of providing a control voltage for active load transistors of the differential input transistors from a drain of one of the cascode transistors.

18. A method as claimed in claim 17 and including the step of limiting voltage between the drains of the differential input transistors.

19. A CMOS amplifier including a level-shifting transistor and a current source transistor for the level-shifting transistor, the amplifier further comprising a bias circuit including a copied level-shifting transistor and a copied current source transistor arranged in a similar manner to the level-shifting transistor and the current source transistor, and a circuit responsive to a level-shifted voltage produced by the copied level-shifting transistor and copied current source transistor for producing a variable bias voltage, the variable bias voltage being supplied to a gate of the current source transistor and to a gate of the copied current source transistor.

* * * * *